(12) United States Patent
Zhou et al.

(10) Patent No.: US 10,194,554 B2
(45) Date of Patent: Jan. 29, 2019

(54) DRIVE ASSEMBLY, CHASSIS ASSEMBLY, AND SERVER DEVICE

(71) Applicant: EMC IP Holding Company LLC, Hopkinton, MA (US)

(72) Inventors: Yujie Zhou, Shanghai (CN); Hendry Xiaoping Wu, Shanghai (CN); Haifang Zhai, Shanghai (CN); David Wei Dong, Shanghai (CN); Aiqin Liu, Shanghai (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 15/464,317

(22) Filed: Mar. 20, 2017

(65) Prior Publication Data
US 2017/0273210 A1    Sep. 21, 2017

(30) Foreign Application Priority Data
Mar. 21, 2016    (CN) .......................... 2016 1 0162663

(51) Int. Cl.
| | |
|---|---|
| *G06F 1/16* | (2006.01) |
| *H05K 7/00* | (2006.01) |
| *H05K 5/00* | (2006.01) |
| *H05K 7/14* | (2006.01) |
| *G11B 33/12* | (2006.01) |

(52) U.S. Cl.
CPC ......... *H05K 7/1487* (2013.01); *G11B 33/122* (2013.01); *H05K 7/1489* (2013.01); *H05K 7/1492* (2013.01)

(58) Field of Classification Search
CPC .. H05K 7/1487; H05K 7/1489; H05K 7/1492; G11B 33/122
USPC ......................... 361/679.31–679.39, 724–727
See application file for complete search history.

(56) References Cited

U.S. PATENT DOCUMENTS

| | | | | |
|---|---|---|---|---|
| 5,673,172 A | * | 9/1997 | Hastings ................. | G06F 1/182 361/679.34 |
| 6,188,571 B1 | * | 2/2001 | Roganti .................. | G06F 1/184 361/679.33 |
| 6,317,334 B1 | * | 11/2001 | Abruzzini ............ | G11B 33/126 361/679.33 |
| 6,442,022 B1 | * | 8/2002 | Paul ..................... | G11B 33/122 361/679.33 |
| 7,209,346 B2 | * | 4/2007 | Fujimoto ............. | G11B 33/126 361/679.33 |
| 8,670,228 B2 | * | 3/2014 | Hiyama ................. | G06F 1/187 361/679.31 |
| 8,749,966 B1 | * | 6/2014 | Boudreau ............... | G06F 1/187 361/679.33 |

(Continued)

*Primary Examiner* — Anthony Haughton
(74) *Attorney, Agent, or Firm* — BainwoodHuang (57) ABSTRACT

Embodiments of the present disclosure relate to a drive assembly, a chassis assembly, and a server device. The drive assembly comprises: a drive having a first end extending in a direction perpendicular to a length direction of the drive and a first side extending in a direction perpendicular to a width direction of the drive, wherein the drive interface is provided at the first end of the drive; and an adapter having first and second interfaces that are electrically connected with each other, wherein the first interface is plugged into the drive interface, and the second interface is adjacent to the first side of the drive so as to be electrically coupled to other components.

13 Claims, 7 Drawing Sheets

(56) References Cited

U.S. PATENT DOCUMENTS

| | | | |
|---|---|---|---|
| 9,715,258 B1* | 7/2017 | Bai | G06F 1/187 |
| 2008/0037211 A1* | 2/2008 | Martin | G11B 25/043 |
| | | | 361/679.37 |
| 2009/0091884 A1* | 4/2009 | Walker | G06F 1/187 |
| | | | 361/679.37 |
| 2014/0065878 A1* | 3/2014 | Huang | H01R 12/724 |
| | | | 439/540.1 |
| 2015/0316964 A1* | 11/2015 | Albert | G06F 1/187 |
| | | | 361/679.36 |
| 2015/0355685 A1* | 12/2015 | Hirano | G06F 1/181 |
| | | | 361/679.33 |

* cited by examiner

DRIVE ASSEMBLY, CHASSIS ASSEMBLY, AND SERVER DEVICE

RELATED APPLICATIONS

This application claim priority from Chinese Patent Application Number CN201610162663.2, filed on Mar. 21, 2016 at the State Intellectual Property Office, China, titled "HARD DISK ASSEMBLY, CHASSIS ASSEMBLY, AND SERVER DEVICE" the contents of which is herein incorporated by reference in its entirety.

FIELD

Various embodiments of the present disclosure relate to the field of servers, and more specifically relates to a drive assembly, a chassis assembly, and a server device.

BACKGROUND

A rack-mounted server is a server whose appearance is designed according to a uniform standard. The objective of designing the rack-mounted server is mainly to reduce space occupied by the server as much as possible. Network devices employing the rack-mounted server include, for example, a switch, a router, and a hardware firewall, etc. The rack-mounted server has a width of 19 inches and a height in a unit of U (1U=1.75 inches=44.45 mm). Usually, the servers have several standards: 1U, 2U, 3U, 4U, 5U, and 7U, etc.

One kind of rack-mounted servers includes a plurality of chassis each having an opening at a front end. A back-plane is disposed at a rear part of each chassis. A drive assembly can be plugged into a corresponding back-plane along a horizontal direction through the front-end opening on the chassis. In such a server, each drive assembly includes a drive and a corresponding carrier device. The drive carrier device provides an interface component plugged into the back-plane along the horizontal direction. However, for such a rack-mounted server, because only one row of drive assemblies can be plugged into each chassis, the chives in the server have a relatively low density.

Another kind of rack-mounted server includes a plurality of chassis each having an opening at the top. There is provided a plurality of back-planes spaced from each other in each chassis. After a drive assembly is placed into a space between neighboring back-planes, it may be plugged into the corresponding back-plane along a horizontal direction. In such a server, each drive assembly also includes a drive and a corresponding carrier device. The drive carrier device also provides an interface component plugged into the back-planes along the horizontal direction. Such a rack-mounted server allows arrangement of a plurality of rows of drives in a single chassis, which increases drive density to a certain extent. However, for such a rack-mounted server, a certain space (e.g., 2 cm) needs to be reserved between neighboring back-planes so as to allow plugging the drive assembly along the horizontal direction, which thus reduces space utilization of the chassis.

SUMMARY

In view of the above, one of the objectives of various embodiments of the present disclosure lies in providing a drive assembly, a chassis assembly, and a server device, so as to increase arrangement density of drives in the rack-mounted server.

According to one aspect of the present disclosure, there is provided a drive assembly, comprising a drive having a first end extending in a direction perpendicular to a length direction of the drive and a first side extending in a direction perpendicular to a width direction of the drive, wherein a drive interface is disposed at the first end of the drive; and an adapter having first and second interfaces that are electrically connected with each other, wherein the first interface is plugged into the drive interface, and the second interface is adjacent to the first side of the drive so as to be electrically coupled to other components.

According to an exemplary embodiment, the adapter includes a printed circuit board, the first interface being disposed on a surface of the printed circuit board, and the second interface being disposed at an end of the printed circuit board.

According to an exemplary embodiment, the other end of the printed circuit board opposite to the end of the printed circuit board is aligned with a second side of the drive, the second side of the drive being opposite to the first side of the drive.

According to an exemplary embodiment, a width of the printed circuit board is equal to or less than a thickness of the drive.

According to an exemplary embodiment, the second interface is a connecting finger.

According to an exemplary embodiment, the drive assembly further comprises a holder that is configured to hold the drive and the adapter.

According to an exemplary embodiment, the holder is a rectangular frame.

According to an exemplary embodiment, the rectangular frame is configured to switch between an open state and a closed state so as to mount the drive and the adapter.

According to an exemplary embodiment, the rectangular frame includes a locking element that switches the rectangular frame from the open state to the closed state.

According to an exemplary embodiment, an opening is disposed at a position on the rectangular frame that corresponds to the second interface and an end of the second interface is disposed in the opening.

According to an exemplary embodiment, a positioning hole is disposed on the drive, and a corresponding positioning protrusion is disposed on the rectangular frame.

According to an exemplary embodiment, the second interface is configured to be plugged into a bottom-plane at a bottom of a chassis.

According to another aspect of the present disclosure, there is disposed a chassis assembly, comprising: a chassis; a bottom-plane disposed at a bottom of the chassis, wherein is a plurality of slots are arranged on the bottom-plane; and at least one drive assembly mentioned above, wherein the second interface of each of the at least one drive assembly is plugged into a corresponding slot.

According to a further aspect of the present disclosure, there is provided a server device, comprising at least one chassis assembly mentioned above.

In various embodiments of the present disclosure, because a drive interface arranged at the end of the drive is transferred to the side of the drive through an adapter, the drive can be vertically plugged onto a bottom-plane at the bottom of a chassis. With such a drive assembly, a plurality of drives may be densely arranged in the chassis, without a need of reserving a larger operation space between drives, thereby capable of enhancing the space utilization of the chassis.

Besides, by vertically plugging the drive assembly at a bottom-plane of the chassis bottom, plugging of the drive assembly becomes smoother, which enhances the operation convenience.

BRIEF DESCRIPTION OF THE DRAWINGS

Through the following detailed description with reference to the accompanying drawings, the above and other objectives, features, and advantages of example embodiments of the present disclosure will become more apparent. Several example embodiments of the present disclosure will be illustrated by way of example but not limitation in the drawings in which.

DETAILED DESCRIPTION OF EMBODIMENTS

Hereinafter, the embodiments of the present disclosure will be described in detail with reference to the accompanying drawings. It should be noted that in the accompanying drawings, similar components or function assemblies may be indicated with same numbers. The accompanying drawings are only intended to illustrate the embodiments of the present disclosure, and thus are not drawn in strict proportion. Those skilled in the art may obtain alternative technical solutions from the description below without departing from the spirit and protection scope of the present disclosure.

Figure 1:
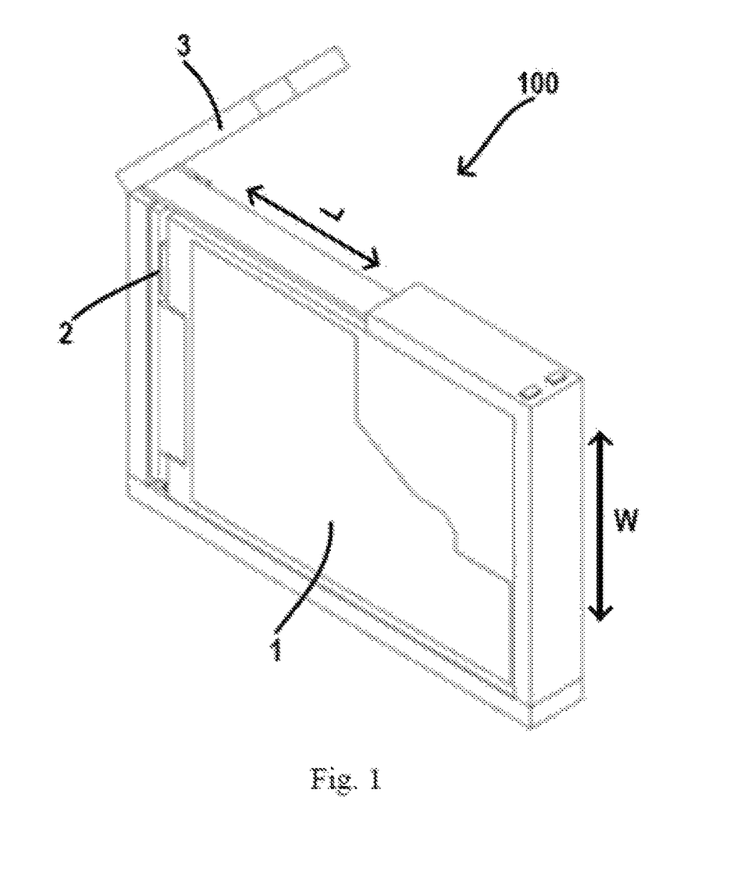
FIG. 1 illustrates a structural diagram of a drive assembly according to an exemplary embodiment of the present disclosure.
Figure 2:
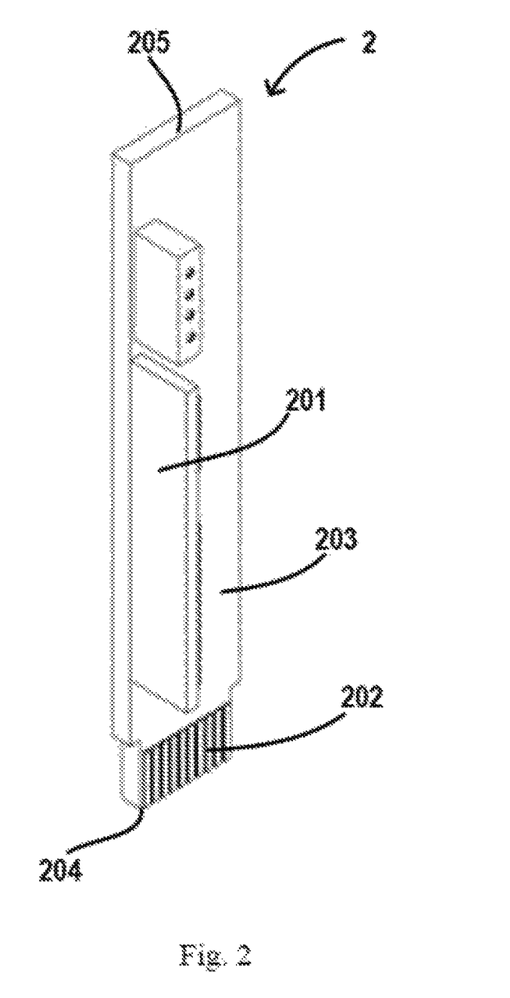
FIG. 2 illustrates a structural diagram of an adapter in the drive assembly shown in FIG. 1.
Figure 3:
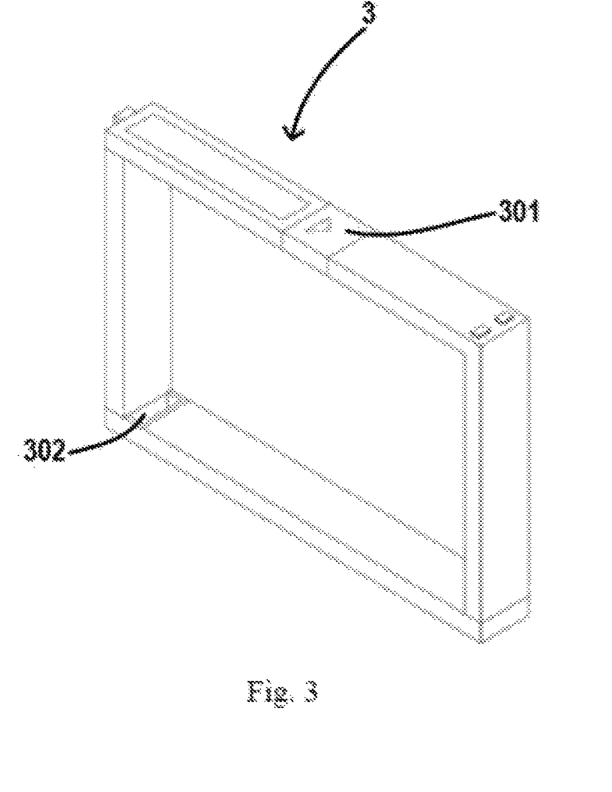
FIG. 3 illustrates a structural diagram of a holder in the drive assembly shown in FIG. 1.
Figure 4:
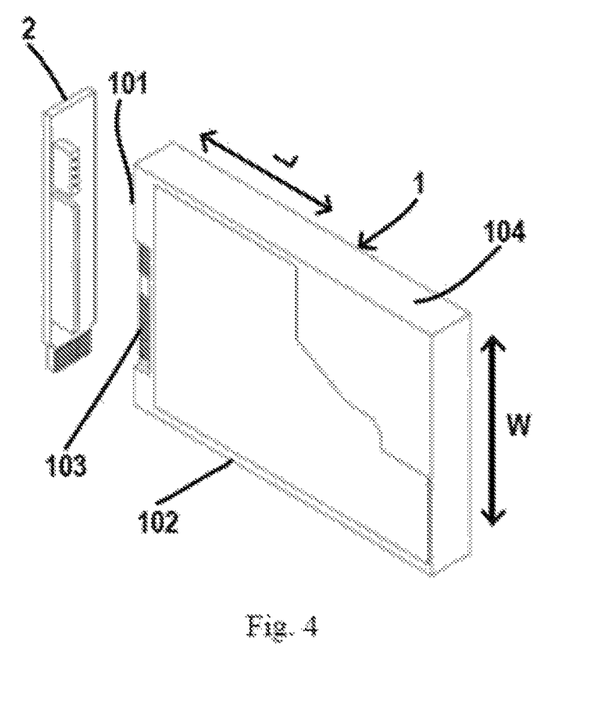
FIG. 4 illustrates a process of assembling the adapter shown in FIG. 2 and a drive.
Figure 5:
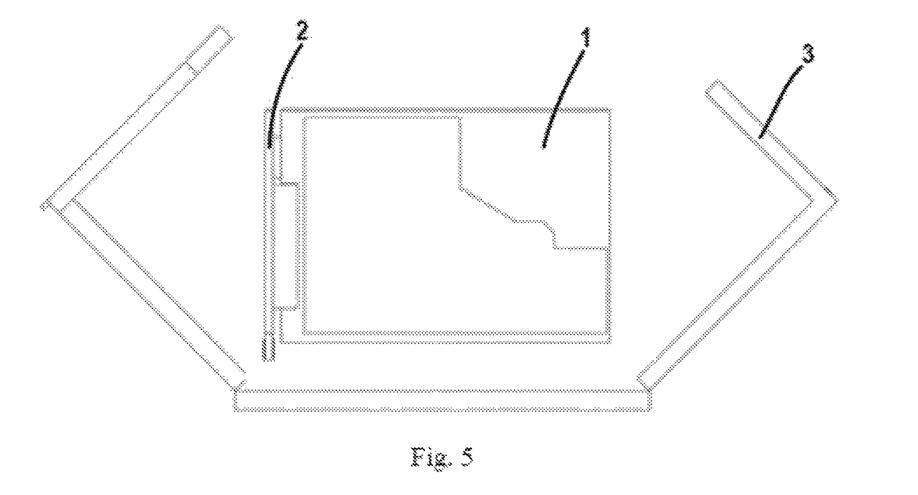
FIG. 5 illustrates a process of mounting the assembled adapter and drive to the holder.

FIG. 1 illustrates a structural diagram of a drive assembly 100 according to an exemplary embodiment of the present disclosure; FIG. 2 illustrates a structural diagram of an adapter 2 in the drive assembly 100 shown in FIG. 1; FIG. 3 illustrates a structural diagram of a holder 3 in the drive assembly 100 shown in FIG. 1; FIG. 4 illustrates a process of assembling the adapter 2 shown in FIG. 2 and a drive 1; FIG. 5 illustrates a process of mounting the assembled adapter 2 and drive 1 to the holder 3.

As illustrated in FIG. 1, the drive assembly 100 comprises a drive 1 and an adapter 2. The drive 1 for example may be a conventional 2.5-inch drive or a 3.5-inch drive. As illustrated in FIG. 4, the drive 1 comprises a first end 101 extending in a direction perpendicular to a length direction L of the drive 1 and a first side 102 extending in a direction perpendicular to a width direction W of the drive 1. A drive interface 103 is disposed at a first end 101 of the drive 1. As illustrated in FIG. 2, the adapter 2 comprises a first interface 201 and a second interface 202 that are electrically connected to each other. The first interface 201 is plugged into a drive interface 103 disposed at the first end 101 of the drive 1. After the adapter 2 is plugged into the drive interface 103, the second interface 202 is adjacent to the first side 102 of the drive 1 so as to be electrically coupled to other electric components. For example, the second interface 202 is used to be plugged into a bottom-plane disposed at the bottom of the chassis, which will be described infra. As illustrated in FIG. 1, the drive assembly 100 further comprises a holder 3. The holder 3 is configured to hold the drive 1 and the adapter 2.

Because the drive interface 103 disposed at the end of the drive 1 is transferred to the side of the drive 1 through the adapter 2, the drive assembly 100 can be vertically plugged into the bottom-plane at the bottom of the chassis. Therefore with such a drive assembly 100, a plurality of rows of drives 1 can be densely arranged in the chassis, without a need of reserving a larger operation space between neighboring drive assemblies 100. In this way, the space utilization of the chassis can be enhanced. This point will be described in detail infra.

FIG. 2 illustrates an example of the adapter 2. As illustrated in FIG. 2, the adapter 2 may comprise a printed circuit board 203. A first interface 201 of the adapter 2 is disposed on a surface of the printed circuit board 203 so as to be connected to a drive interface 103 at the first end 101 of the drive 1. The second interface 202 is disposed at an end 204 of the printed circuit board 203 such that the second interface 202 is adjacent to the first side 102 of the drive 1 if the adapter 2 and the drive 1 are assembled together. The second interface 202 may be au interference of various kinds, e.g., a connector, a connecting finger, etc. In the adapter 2 shown in FIG. 2, the second interface 202 is formed as a connecting finger. The connecting finger has advantages of a small size, a reliable connection, and a low cost; therefore, it can save space and reduce the overall cost of the drive assembly 100.

As illustrated in FIG. 3, the holder 3 may be generally formed into a rectangular frame. The holder 3 may switch between an open state and a closed state so as to facilitate mounting the drive 1 and the adapter 2. The holder 3 illustrated in FIG. 3 is in a closed state, while the holder 3 in FIG. 5 is in an open state. An opening 302 is disposed at a position, which corresponds to the second interface 202, on the holder 3, such that the end of the second interface 202 is disposed within the opening 302. A locking element 301 may be disposed on the holder 3 so as to lock the holder 3 when the holder 3 is in the closed state.

Hereinafter, an assembling process of the drive assembly 100 will be described with reference to FIGS. 4 and 5.

As illustrated in FIG. 4, the first interface 201 of the adapter 2 may be plugged into the drive interface 103 of the drive 1. In the orientation shown in FIG. 4, the first side 102 of the drive 1 refers to a bottom side of the drive 1, while the second side 104 of the drive 1 refers to a top side of the drive 1. As illustrated in FIG. 5, after the assembled adapter 2 and drive 1 are placed in the holder 3, two side parts of the holder 3 may be pushed towards the middle. After the holder 3 surrounds the adapter 2 and the drive 1, the locking element 301 may be pushed such that the holder 3 switches to the closed state from the open state, thereby completing the assembling process of the drive assembly 100.

Besides, in conjunction with FIG. 2 and FIG. 5, the other end 205 of the printed circuit board 203 opposite to the end 204 of the printed circuit board 203 may be aligned with the second side 104 of the drive 1. The second side 104 of the drive 1 is opposite to the first side of the drive 1. The width of the printed circuit board 203 may be equal to or less than a thickness of the drive 1 so as to reduce the overall size of the drive assembly 100.

Besides, a positioning hole (not shown) may also be disposed on the drive 1, and a corresponding positioning protrusion (not shown) may be disposed on the holder 3. If the drive 1 and the adapter 2 are mounted onto the holder 3, the positioning hole of the drive 1 may cooperate with the positioning protrusion on the holder 3, such that the engagement of the drive 1 and the adapter 2 with the holder 3 is more secure.

Figure 6:
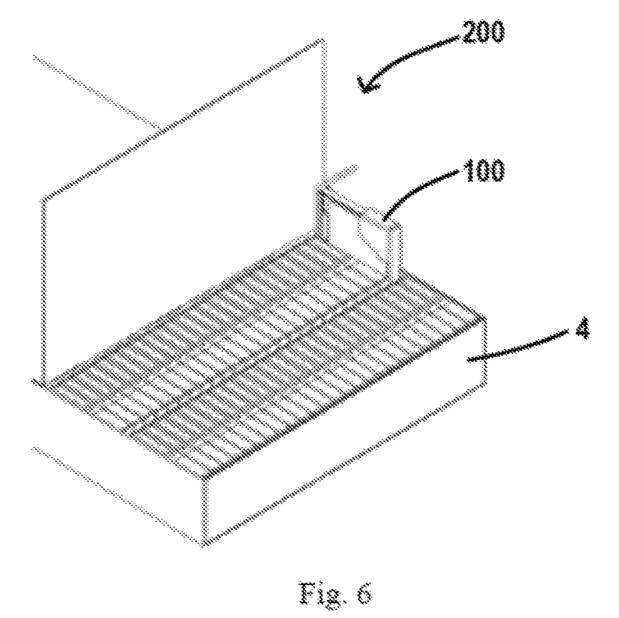
FIG. 6 illustrates a structural diagram of a chassis assembly including a plurality of drive assemblies shown in FIG. 1.
Figure 7:
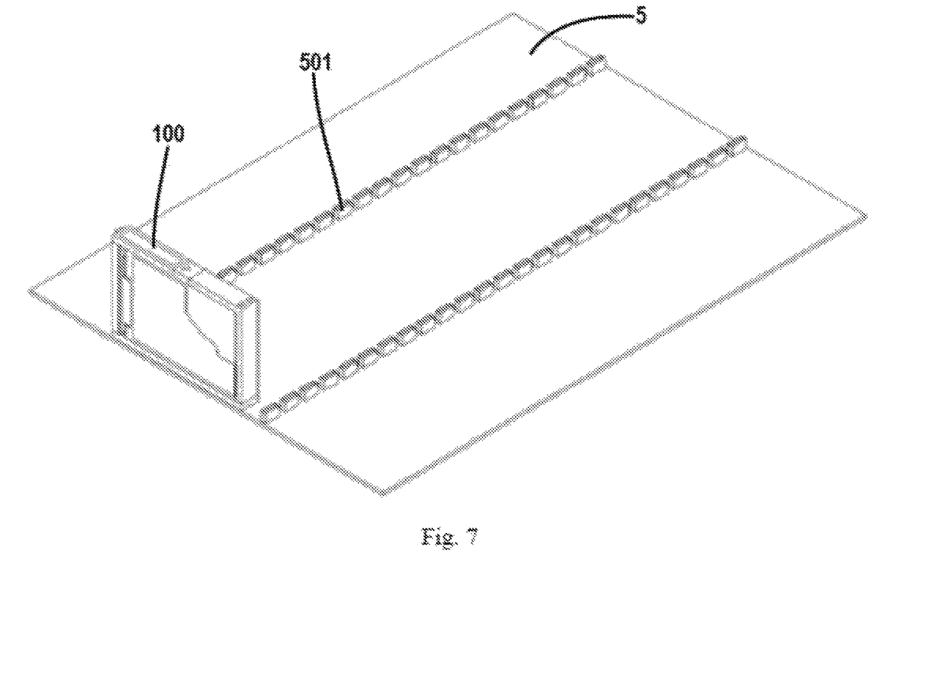
FIG. 7 illustrates a bottom-plane in the chassis assembly shown in FIG. 6 and a drive assembly plugged into the bottom-plane.

FIG. 6 illustrates a structural diagram of a chassis assembly 100 including a plurality of drive assemblies 200 shown in FIG. 1; and FIG. 7 illustrates a bottom-plane 5 in the chassis assembly shown 200 in FIG. 6 and a drive assembly 100 plugged into the bottom-plane 5.

As illustrated in FIGS. 6 and 7, the chassis assembly 200 comprises a chassis 4, a bottom-plane 5 and at least one drive assembly 100. The bottom-plane 5 is disposed at the bottom of the chassis 4. A plurality of rows of slots 501 are disposed on the bottom-plane 5. The second interface 202 of each drive assembly 100 is plugged into the corresponding slot 501. The overall size of the slot 501 is adapted to a size of the opening 302 provided in the holder 3 mentioned above, so as to facilitate the plugging operation.

Because the drive interface 103 arranged at the end of the drive 1 is transferred to the side of the drive 1 through the adapter 3, the drive assembly 100 can be vertically plugged into the slot 501 disposed on the bottom-plane 5 at the bottom of the chassis 4. With such a drive assembly 100, a plurality of drive assemblies 100 may be densely arranged in the chassis 4, without a need of reserving a larger operation space between neighboring drive assemblies 100, thereby capable of enhancing the space utilization of the chassis 4.

Besides, by vertically plugging the drive assembly 100 onto the bottom-plane 5 at the bottom of the chassis 4, plugging of the drive assembly 100 becomes smoother, which enhances operation convenience.

In other embodiments, there is also provided a server device, including at least one chassis assembly 200. Such a server device for example may be applied in a network device such as a switch, a router, or a hardware firewall, etc.

The specification of the present disclosure has been provided above for illustration is and description purposes, which is not intended to exhaust or be restricted to the disclosed forms. Those skilled in the art may envisage many modifications and variables.

Therefore, the embodiments are only for better illustrating the principle and practical application of the present disclosure, and are selected and described to enable other people skilled in the art to understand the following contents, i.e., without departing from the spirit of the present disclosure, all modification and replacements will fall within the protection scope of the present disclosure defined in the appended claims.

What is claimed is:

1. A drive assembly, comprising:
a drive having a first end extending in a direction perpendicular to a length direction of the drive and a first side extending in a direction perpendicular to a width direction of the drive, wherein a drive interface is disposed at the first end of the drive; and
an adapter having first and second interfaces that are electrically connected with each other, wherein the first interface is plugged into the drive interface, and the second interface is adjacent to the first side of the drive so as to be electrically coupled to other components, wherein the second interface is perpendicular to the first interface protruding from the adapter such that the second interface is a single plane with the adapter.

2. The drive assembly according to claim 1, wherein the adapter includes a printed circuit board, the first interface being disposed on a surface of the printed circuit board, and the second interface being disposed at an end of the printed circuit board.

3. The drive assembly according to claim 2, wherein the other end of the printed circuit board opposite to the end of the printed circuit board is aligned with a second side of the drive, the second side of the drive being opposite to the first side of the drive.

4. The drive assembly according to claim 2, wherein a width of the printed circuit board is equal to or less than a thickness of the drive.

5. The drive assembly according to claim 2, wherein the second interface is a connecting finger.

6. The drive assembly according to claim 1, further comprising a holder configured to hold the drive and the adapter.

7. The drive assembly according to claim 1, wherein the holder is a rectangular frame.

8. The drive assembly according to claim 7, wherein the rectangular frame is configured to switch between an open state and a closed state so as to mount the drive and the adapter.

9. The drive assembly according to claim 8, wherein the rectangular frame includes a locking element that switches the rectangular frame from the open state to the closed state.

10. The drive assembly according to claim 7, wherein an opening is provided at a position on the rectangular frame that corresponds to the second interface and an end of the second interface is disposed in the opening.

11. The drive assembly according to claim 7, wherein a positioning hole is disposed on the drive and a corresponding positioning protrusion is disposed on the rectangular frame.

12. The drive assembly according to claim 1, wherein the second interface is configured to be plugged into a bottom plane at a bottom of a chassis.

13. A chassis assembly, comprising:
a chassis;
a bottom plane disposed at a bottom of the chassis, wherein a plurality of slots are arranged on the bottom plane; and
at least one drive assembly comprising:
a drive having a first end extending in a direction perpendicular to a length direction of the drive and a first side extending in a direction perpendicular to a width direction of the drive, wherein a drive interface is disposed at the first end of the drive; and
an adapter having first and second interfaces that are electrically connected with each other, wherein the first interface is plugged into the drive interface, and the second interface is adjacent to the first side of the drive so as to be electrically coupled to other components, wherein the second interface is perpendicular to the first interface protruding from the adapter such that the second interface is a single plane with the adapter;
wherein the second interface of each of the at least one drive assembly is plugged into a corresponding slot.

* * * * *